(12) United States Patent
Kim et al.

(10) Patent No.: US 9,190,629 B2
(45) Date of Patent: Nov. 17, 2015

(54) FLEXIBLE ORGANIC ELECTROLUMINESCENT DEVICE AND METHOD FOR FABRICATING THE SAME

(71) Applicant: LG DISPLAY CO., LTD., Seoul (KR)

(72) Inventors: Do Hyung Kim, Paju-si (KR); Mi So Kim, Seoul (KR); Chi Min Choi, Cheonan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 57 days.

(21) Appl. No.: 14/074,349

(22) Filed: Nov. 7, 2013

(65) Prior Publication Data

US 2014/0131682 A1    May 15, 2014

(30) Foreign Application Priority Data

Nov. 9, 2012  (KR) .................. 10-2012-0126907

(51) Int. Cl.
| | |
|---|---|
| *H01L 35/24* | (2006.01) |
| *H01L 51/56* | (2006.01) |
| *H01L 51/52* | (2006.01) |
| *H01L 27/32* | (2006.01) |

(52) U.S. Cl.
CPC ............ *H01L 51/56* (2013.01); *H01L 27/3244* (2013.01); *H01L 51/5253* (2013.01); *H01L 2251/5338* (2013.01)

(58) Field of Classification Search
CPC .......................... H01L 27/32; H01L 27/3262
USPC ............................................. 257/40; 438/22
See application file for complete search history.

(56) References Cited

U.S. PATENT DOCUMENTS

2014/0117336 A1*  5/2014  Kim et al. ................... 257/40

* cited by examiner

*Primary Examiner* — Theresa T Doan
(74) *Attorney, Agent, or Firm* — Dentons US LLP

(57) ABSTRACT

Disclosed are a flexible organic electroluminescent device, and a method for fabricating the same. The flexible organic electroluminescent device comprises a non-active area formed outside an active area of a substrate; a switching thin film transistor and a driving thin film transistor on the substrate; an interlayer insulating layer formed on the substrate; a first electrode formed on the interlayer insulating layer; a bank formed in the non-active area of the substrate; an organic light-emitting layer formed on the first electrode; a second electrode formed on the organic light-emitting layer; a first passivation layer formed on the substrate; an organic layer formed on the first passivation layer; a partition wall pattern formed on the first passivation layer; a second passivation layer formed on the first passivation layer; and a barrier film disposed to face the substrate.

4 Claims, 10 Drawing Sheets

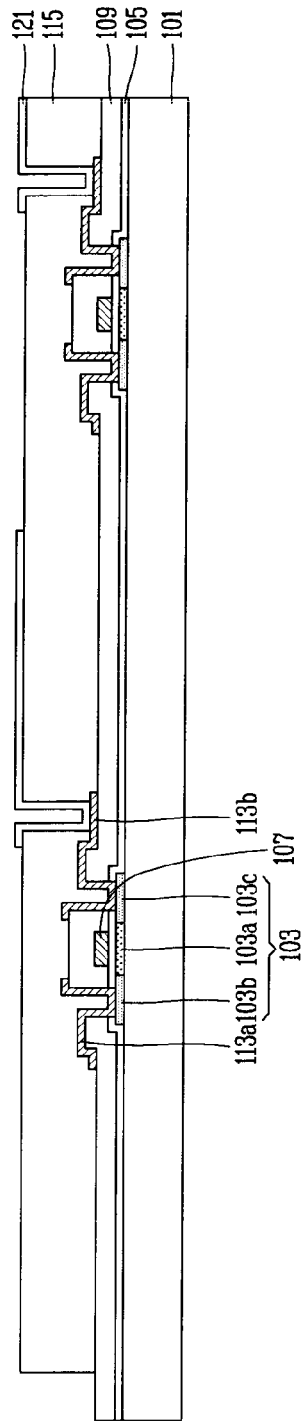
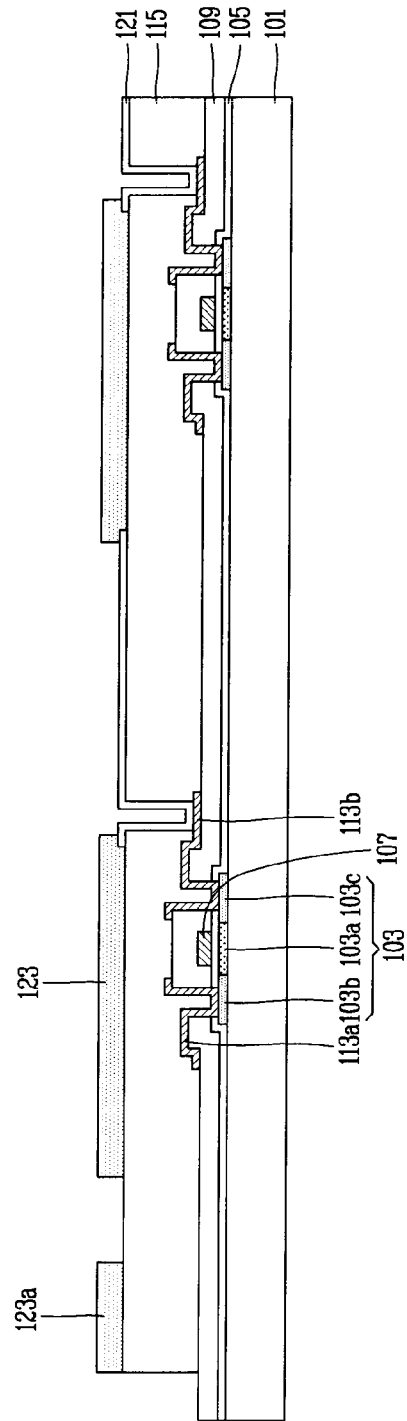

FLEXIBLE ORGANIC ELECTROLUMINESCENT DEVICE AND METHOD FOR FABRICATING THE SAME

CROSS REFERENCE TO RELATED APPLICATIONS

Pursuant to 35 U.S.C. §119(a), this application claims the benefit of Korean Patent Application No. 10-2012-0126907, filed on Nov. 9, 2012, the contents of which are incorporated by reference for all purposes herein in its entirety.

BACKGROUND OF THE INVENTION

1. Field of the Invention

The present invention relates to an organic light-emitting diode (OLED) device. More particularly, the invention relates to a flexible organic electroluminescent device having an increased lifespan by preventing introduction of water thereto, and a method for fabricating the same.

2. Discussion of the Related Art

An organic light-emitting diode (OLED) device, one type of flat panel display device, has high brightness and a low operation voltage. Further, the OLED device has a high contrast ratio because it is a spontaneous light-emitting type, and it can implement a display of an ultra thin thickness. The OLED device can easily implement moving images due to a short response time corresponding to several micro seconds (μs). The OLED device has no limitation in a viewing angle, and has a stable characteristic even at low temperatures. Further, as the OLED device is driven at a low voltage such as a direct current of 5-15 v, it is easy to fabricate and design driving circuits.

The OLED device can be fabricated in a very simple manner because only deposition and encapsulation equipment is required.

The OLED device having such characteristics is largely categorized into a passive matrix type and an active matrix type. In the passive matrix type, scan lines and signal lines cross each other to form an OLED device in a matrix form. In order to drive each pixel, the scan lines are sequentially driven. Accordingly, for a required average brightness, an instantaneous brightness, a value obtained by multiplying an average brightness by the number of lines, should be implemented.

On the other hand, in the active matrix type, a thin film transistor (TFT), a switching device for turning on/off a pixel region, is located at each pixel region. A driving thin film transistor connected to the switching thin film transistor is connected to a power line and a light-emitting diode, and is formed at each pixel region.

A first electrode connected to the driving thin film transistor is turned on/off in unit of a pixel region, and a second electrode facing the first electrode serves as a common electrode. The first electrode, the second electrode, and an organic light-emitting layer interposed between the two electrodes constitute the light-emitting diode.

In such an active matrix type, a voltage applied to a pixel region is charged in a storage capacitor (Cst). Power should be applied to the OLED device until a subsequent frame signal is applied to the OLED device. Under such configuration, the OLED device is continuously driven for a single frame, regardless of the number of scan lines.

Even if a low current is applied to the OLED device, the same brightness is implemented. Owing to characteristics of low power consumption, high resolution and a large screen, the active matrix type is being spotlighted in recent years.

A basic structure and an operation characteristic of such an active matrix type OLED device will be explained with reference to the attached drawings.

FIG. 1 is a circuit diagram illustrating a configuration of a single pixel region of an active matrix type OLED device in accordance with the related art.

Referring to FIG. 1, a single pixel region of an active matrix type OLED device is composed of a switching thin film transistor (STr), a driving thin film transistor (DTr), a storage capacitor (Cst) and a light-emitting diode (E).

Gate lines (GL) are formed in a first direction, and data lines (DL) are formed in a second direction perpendicular to the first direction, thereby defining pixel regions (P). A power line (PL) for applying a power voltage to the OLED device is spaced from the data line (DL).

A switching thin film transistor (STr) is formed at an intersection between the data line (DL) and the gate line (GL), and a driving thin film transistor (DTr) electrically connected to the switching thin film transistor (STr) is formed in each pixel region (P).

The DTr is electrically connected to a light-emitting diode (E). More specifically, a first electrode, a terminal disposed at one side of the light-emitting diode (E) is connected to a drain electrode of the DTr. A second electrode, a terminal disposed at another side of the light-emitting diode (E) is connected to a power line (PL). The power line (PL) transmits a power voltage to the light-emitting diode (E). A storage capacitor (Cst) is formed between a gate electrode and a source electrode of the DTr.

When a signal is applied to the OLED device through the gate lines (GL), the STr is turned on. The DTr is turned on as a signal of the data lines (DL) is transmitted to the gate electrode thereof. Accordingly, light is emitted through the light-emitting diode (E). If the DTr is turned on, a level of a current applied to the light-emitting diode (E) from the power line (PL) is determined. As a result, the light-emitting diode (E) can implement a gray scale. The storage capacitor (Cst) serves to maintain a gate voltage of the DTr constantly when the STr is turned off. Accordingly, even if the STr is turned off, a level of a current applied to the light-emitting diode (E) can be constantly maintained for the next frame.

FIG. 2 is a sectional view illustrating an OLED device in accordance with the related art.

FIG. 3 is a sectional view taken along line "III-III" in FIG. 2, which schematically illustrates an OLED device in accordance with the related art.

FIG. 4 is an enlarged sectional view of part 'A' in FIG. 3, which illustrates that water introduced into an OLED device through side surfaces of the OLED device spreads through a bank and a planarization layer.

Referring to FIG. 2, in the related art OLED device, an active area (AA, display region) and a non-active area (NA, non-display region) formed outside the active area (AA) are defined on a substrate 11. A plurality of pixel regions (P) defined by gate lines (not shown) and data lines (not shown) are formed at the active area (AA). A power line (not shown) is formed in parallel to the data lines (not shown).

A switching thin film transistor (not shown) and a driving thin film transistor (DTr) are formed at each pixel region (P).

In the related art organic light-emitting diode device, the substrate 11, where the DTr and the light-emitting diode (E) have been formed, is encapsulated by a barrier film (not shown).

The related art OLED device will be explained in more detail. As shown in FIG. 3, an active area (AA) and a non-active area (NA) formed outside the active area (AA) are defined on a substrate 11. A plurality of pixel regions (P)

defined by gate lines (not shown) and data lines (not shown) are formed at the active area (AA). A power line (not shown) is formed in parallel to the data lines (not shown).

A buffer layer (not shown), formed of an insulating material, e.g., an inorganic insulating material such as silicon dioxide ($SiO_2$) or silicon nitride (SiNx), is formed on the substrate 11.

A semiconductor layer 13 is formed at each pixel region (P) in the active area (AA) above the buffer layer (not shown). The semiconductor layer 13 is formed to correspond to a driving region (not shown) and a switching region (not shown). The semiconductor layer 13 is composed of a first region 13a formed of pure poly silicone and forming a channel; and second regions 13b and 13c formed of pure poly silicone, disposed at two sides of the first region 13a, and to which impurities of high concentration are doped.

A gate insulating layer 15 is formed on the buffer layer (not shown) including the semiconductor layer 13. A gate electrode 17 is formed on the gate insulating layer 15 in correspondence to the first region 13a of the semiconductor layer 13 in the driving region (not shown) and the switching region (not shown).

A gate line (not shown), connected to the gate electrode 17 formed at the switching region (not shown) and extending to one direction, is formed on the gate insulating layer 15.

An interlayer insulating layer 19 is formed on an entire surface of the substrate including the gate electrode 17 and the gate line (not shown), in the active area. Semiconductor layer contact holes (not shown), through which the second regions 13b and 13c disposed at two sides of the first region 13a of the semiconductor layer 13 are exposed to outside, are provided at the interlayer insulating layer 19 and the gate insulating layer 15 formed therebelow.

Data lines (not shown), which define the pixel regions (P) by crossing the gate lines (not shown) and formed of a second metallic material layer, are formed on the interlayer insulting layer 19 including the semiconductor layer contact holes (not shown). A power line (not shown) is formed in a spaced manner from the data lines. The power line (not shown) may be formed on the gate insulating layer 15 where the gate lines (not shown) have been formed, in a spaced manner from the gate lines (not shown), in parallel thereto.

A source electrode 23a and a drain electrode 23b, made of the same second metallic material as the data lines (not shown), are formed at a driving region (not shown) and a switching region (not shown) on the interlayer insulating layer 19. The source electrode 23a and the drain electrode 23b are spaced from each other, and contact the second regions 13b and 13c exposed to outside through the semiconductor layer contact holes (not shown). Under such configuration, the semiconductor layer 13, the gate insulating layer 15, the gate electrode 17 and the interlayer insulating layer 19 sequentially deposited on the driving region (not shown), form a driving thin film transistor (not shown), together with the source electrode 23a and the drain electrode 23b which are spaced from each other.

A planarization layer 25, having a drain contact hole (not shown) through which the drain electrode 23b of the driving thin film transistor (DTr) is exposed to outside, is formed on the driving thin film transistor (DTr) and the switching thin film transistor (not shown).

A first electrode 31, which contacts the drain electrode 23b of the driving thin film transistor (DTr) through the drain contact hole (not shown), is formed on the planarization layer 25 in a separated manner for each pixel region (P).

A bank 33 is formed on the first electrode 31, in the non-active area (NA), i.e., an area outside each pixel region (P). The bank 33 is formed so that the pixel regions (P) can be separated from each other.

An organic light-emitting layer 35, composed of organic light-emitting patterns (not shown) which emit red, green and blue light, is formed on the first electrode 31 in each pixel (P) enclosed by the bank 33.

A second electrode 37 is formed in the active area (AA) of the substrate including the organic light-emitting layer 35 and the bank 33. The first electrode 31, the second electrode 37, and the organic light-emitting layer 35 interposed between the two electrodes 31 and 37 form a light-emitting diode (E).

For prevention of introduction of water into the OLED device, a passivation layer 39 is further formed on the entire surface of the substrate 11 including the second electrode 37.

A barrier film 43 is positioned on the entire surface of the substrate 11 including the passivation layer 39 in a facing manner, for encapsulation of the light-emitting diode (E). An adhesive 41 is interposed between the substrate 11 and the barrier film 43, so that the substrate 11 and the barrier film 43 can be completely attached to each other without an air layer therebetween. The passivation layer 39, the adhesive 41 and the barrier film 43 have a face seal structure.

As the substrate 11 and the barrier film 43 are attached to each other by the adhesive 41 to thus form a panel, the OLED device 10 according to the related art is complete.

However, the related art OLED device may have the following problems:

Firstly, in the related art face seal structure, e. g., in a lamination structure among the passivation layer 39, the adhesive 41 and the barrier film 43, the passivation layer 39 and the barrier film 43 serve as a barrier for preventing introduction of water into the OLED device. However, the adhesive 41 cannot serve well as a barrier. This means that introduction of water occurs easily from the side surfaces of the OLED device, rather than from the upper surface.

Secondly, if foreign materials or cracks do not occur between thin films in the related art face seal structure, introduction of water into the OLED device does not occur. However, as shown in FIG. 4, introduction of water into the OLED device actually occurs due to foreign materials, etc. generated when a lower layer is processed.

Especially, step coverage of the passivation layer 39 forms a boundary around foreign materials. In this case, the boundary serves as a passage through which water is introduced into the OLED device.

Water introduced into the adhesive 41 having a low barrier function is firstly introduced into the OLED device, through the boundary. Then, the water is secondary introduced into the OLED device, through a lower organic layer of a thin film transistor, e.g., a bank and a planarization layer. This may result in oxidation of a cathode of the OLED device.

SUMMARY OF THE INVENTION

Therefore, an aspect of the detailed description is to provide a flexible organic electroluminescent device capable of enhancing reliability by preventing water from being introduced thereinto, by forming a partition wall pattern to enclose a panel outside the panel, in a separate manner from an organic layer formed in an active area, and a method for fabricating the same.

To achieve these and other advantages and in accordance with the purpose of this specification, as embodied and broadly described herein, there is provided a flexible organic electroluminescent device, there is provided a flexible organic electroluminescent device, comprising: a substrate divided into an active area including a plurality of pixel regions, and a non-active area formed outside the active area; a switching thin film transistor and a driving thin film transistor formed at each of the pixel regions on the substrate; an interlayer insulating layer formed on the substrate including the switching thin film transistor and the driving thin film transistor, and configured to expose a drain electrode of the driving thin film transistor therethrough; a first electrode formed at each pixel region on the interlayer insulating layer, and connected to the drain electrode of the driving thin film transistor; a bank formed in the non-active area of the substrate; an organic light-emitting layer formed on the first electrode, and separated from each other at each pixel region; a second electrode formed on the organic light-emitting layer in the active area; a first passivation layer formed on an entire surface of the substrate including the second electrode; an organic layer formed on the first passivation layer, in the active area; a partition wall pattern separated from the organic layer, and formed on the first passivation layer in the non-active area so as to enclose the active area; a second passivation layer formed on the first passivation layer including the organic layer and the partition wall pattern; a barrier film disposed to face the substrate; and an adhesive interposed between the substrate and the barrier film, and configured to adhere the substrate and the barrier film to each other to form a panel.

To achieve these and other advantages and in accordance with the purpose of this specification, as embodied and broadly described herein, there is also provided a method for fabricating a flexible organic electroluminescent device, the method comprising: providing a substrate divided into an active area including a plurality of pixel regions, and a non-active area formed outside the active area; forming a switching thin film transistor and a driving thin film transistor at each of the pixel regions on the substrate; forming an interlayer insulating layer on the substrate including the switching thin film transistor and the driving thin film transistor, and configured to expose a drain electrode of the driving thin film transistor therethrough; forming a first electrode at each pixel region on the interlayer insulating layer, the first electrode connected to the drain electrode of the driving thin film transistor; forming a bank in the non-active area of the substrate; forming an organic light-emitting layer on the first electrode, the organic light-emitting layer separated from each other at each pixel region; forming a second electrode on the organic light-emitting layer in the active area; forming a first passivation layer on an entire surface of the substrate including the second electrode; forming an organic layer on the first passivation layer, in the active area; forming a partition wall pattern on the first passivation layer in the non-active area so as to enclose the active area, the partition wall pattern separated from the organic layer; and forming a second passivation layer on the first passivation layer including the organic layer and the partition wall pattern; and adhering a barrier film to the substrate to form a panel.

The present invention can have the following advantages:

Firstly, the partition wall pattern is formed in a separate manner from the organic layer formed in the active area. The partition wall pattern, formed to enclose the panel outside the panel, prevents water from being introduced into the OLED device. This can allow the OLED device to have enhanced reliability. Especially, the partition wall pattern is formed on the interlayer insulating layer or the bank in the non-active area. Under such configuration, introduction of water into the OLED device due to foreign materials can be prevented. Further, even if water is introduced to the second passivation layer from a region outside the barrier film, the water is prevented from spreading into the panel, because the partition wall pattern is separated from the organic layer formed in the active area.

Secondly, water is prevented from spreading into the panel owing to the partition wall pattern formed in the non-active area so as to enclose the active area. Accordingly, introduction of water into the OLED device in high temperature and high humidity can be prevented.

Thirdly, as step coverage occurring from a lower part of the thin film transistor is reduced, an auto clave process can be omitted. This can simplify the entire processes.

Fourthly, as the auto clave process omitted, other problems such as occurrence of spots and introduction of water can be prevented. This can allow the OLED device to have an enhanced yield.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIGS. 8A to 8G are sectional views schematically illustrating a method for fabricating a flexible OLED device according to the present invention.

DETAILED DESCRIPTION OF THE ILLUSTRATED EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a flexible organic electroluminescent device (OLED) according to the present invention will be explained in more detail with reference to the attached drawings.

Figure 1:
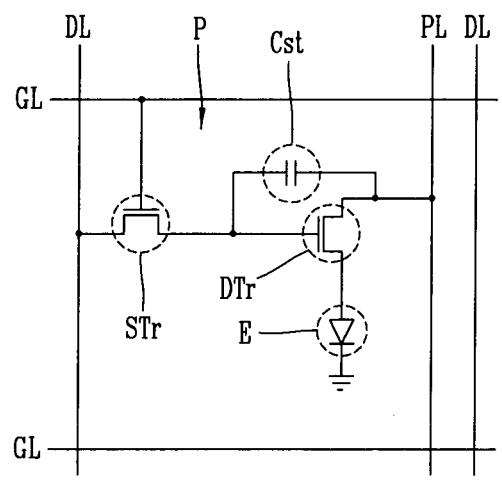
FIG. 1 is circuit diagram illustrating a configuration of one pixel region of an active matrix type organic electroluminescent device (OLED) in accordance with the related art.
Figure 2:
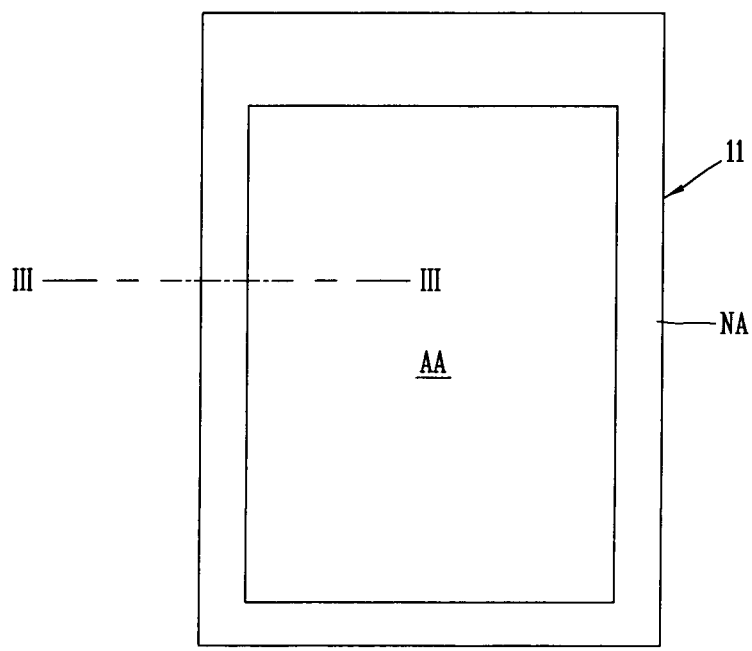
FIG. 2 is a planar view illustrating an OLED device in accordance with the related art.
Figure 3:
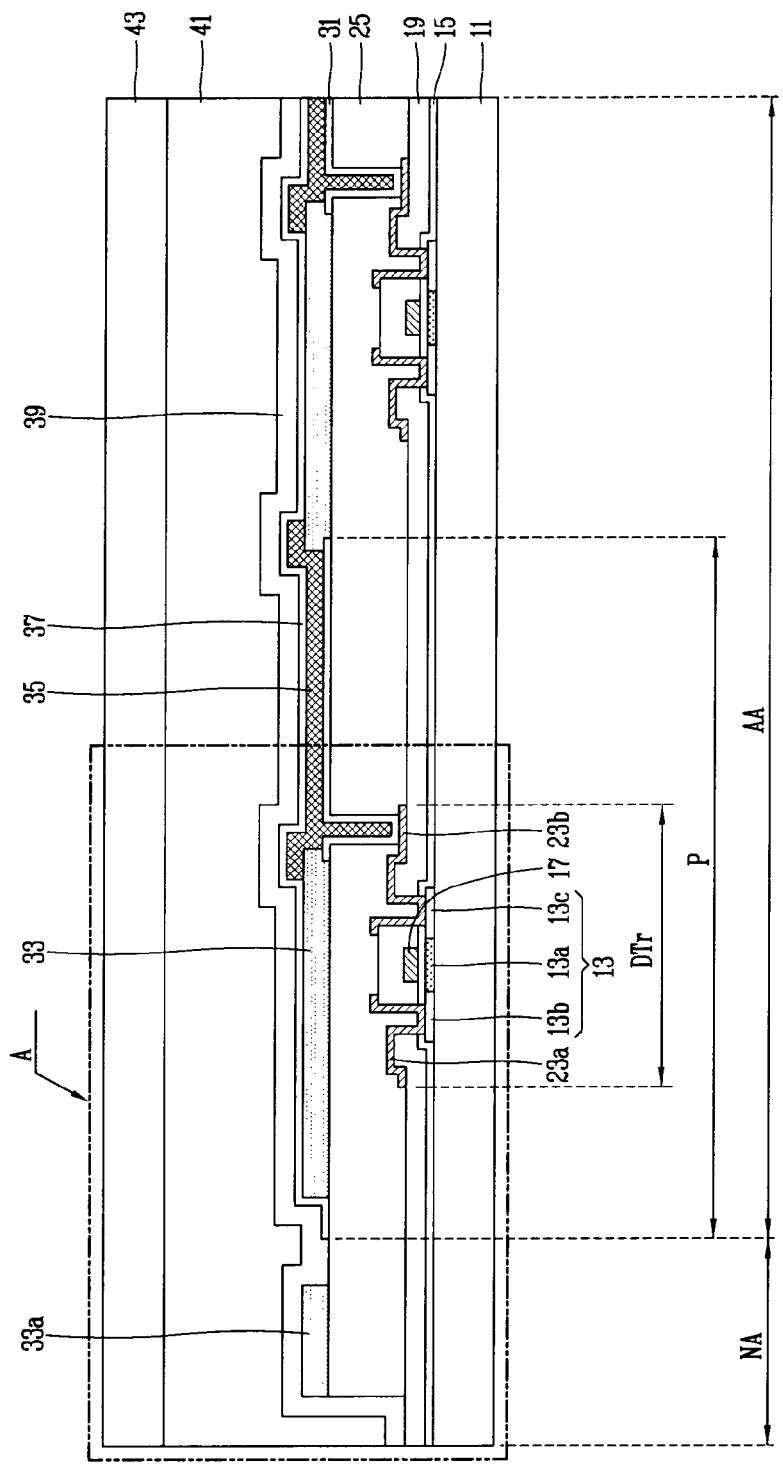
FIG. 3 is a sectional view taken along line in FIG. 2, which schematically illustrates an OLED device in accordance with the related art.
Figure 4:
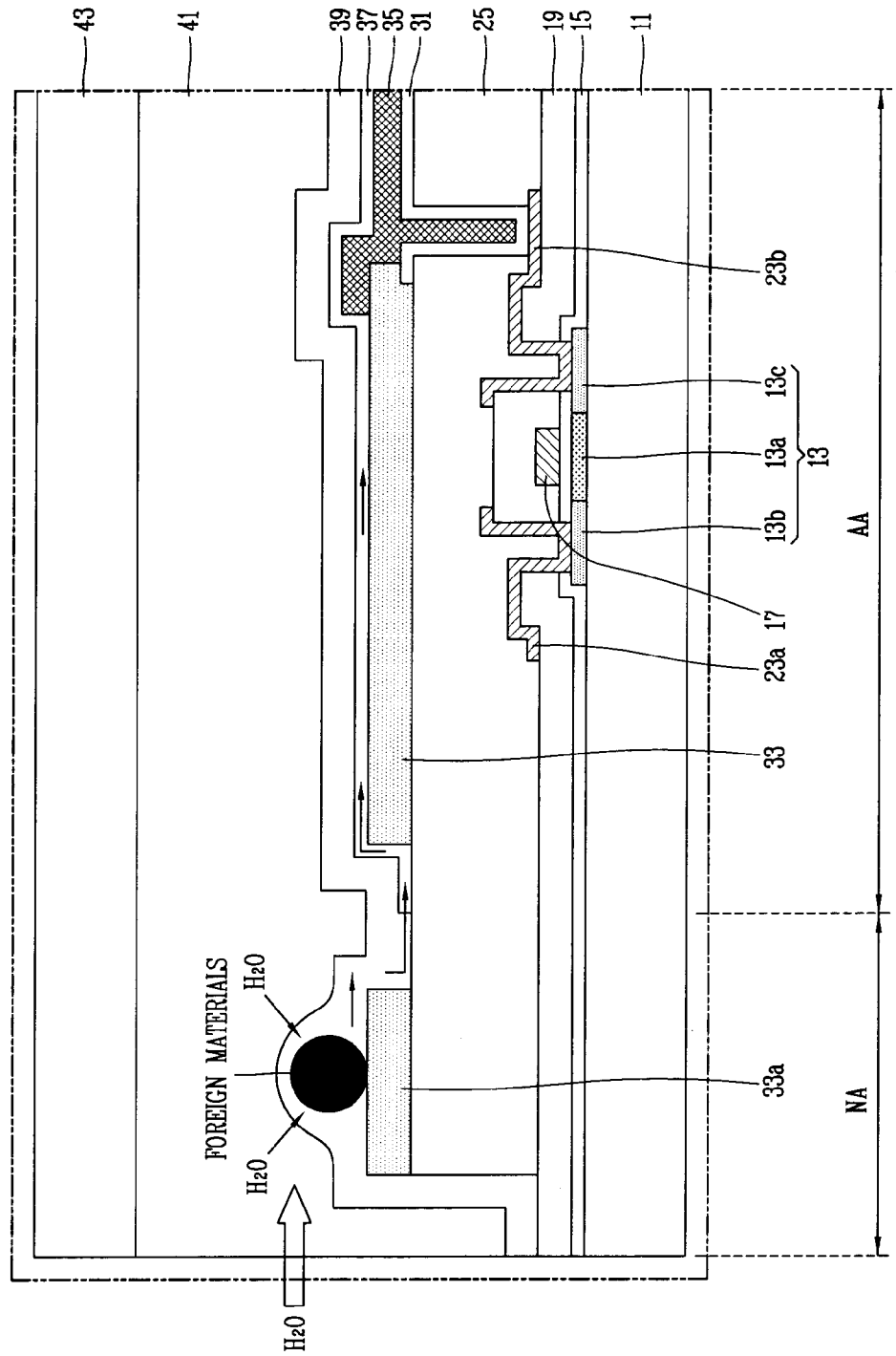
FIG. 4 is an enlarged sectional view of part 'A' in FIG. 3, which schematically illustrates that water introduced to side surfaces of an OLED device spreads through a bank and a planarization layer.
Figure 5:
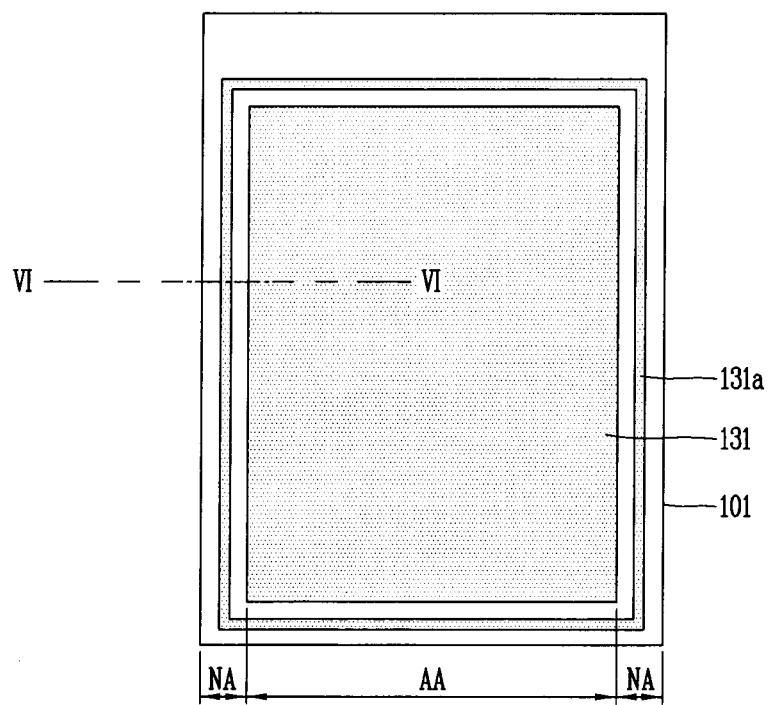
FIG. 5 is a planar view schematically illustrating a flexible OLED device according to the present invention.

FIG. 5 is a planar view schematically illustrating a flexible OLED device according to the present invention.

Figure 6:
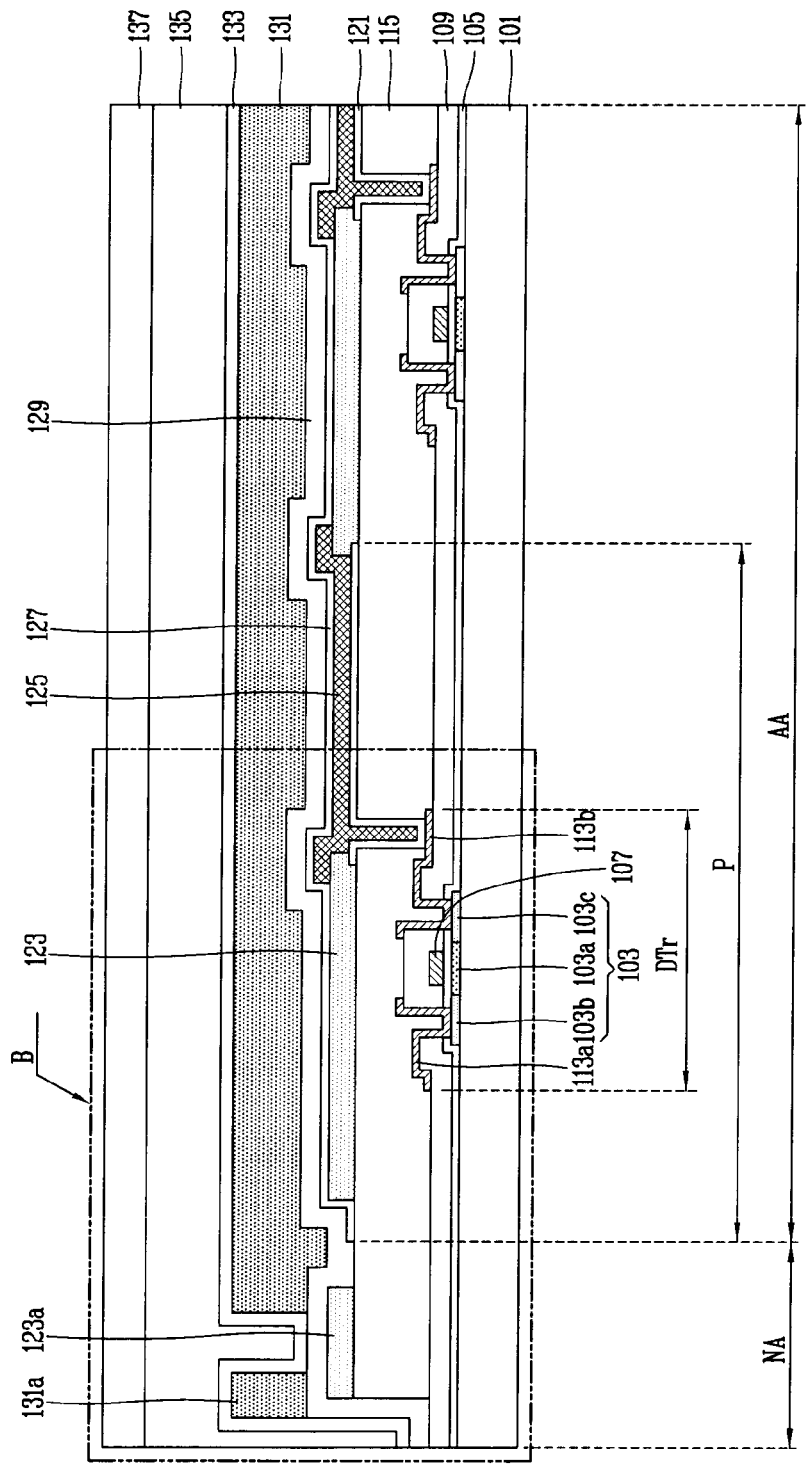
FIG. 6 is a sectional view taken along line 'VI-VI' in FIG. 5, which schematically illustrates a flexible OLED device according to the present invention.

FIG. 6 is a sectional view taken along line 'VI-VI' in FIG. 5, which schematically illustrates a flexible OLED device according to the present invention.

Figure 7:
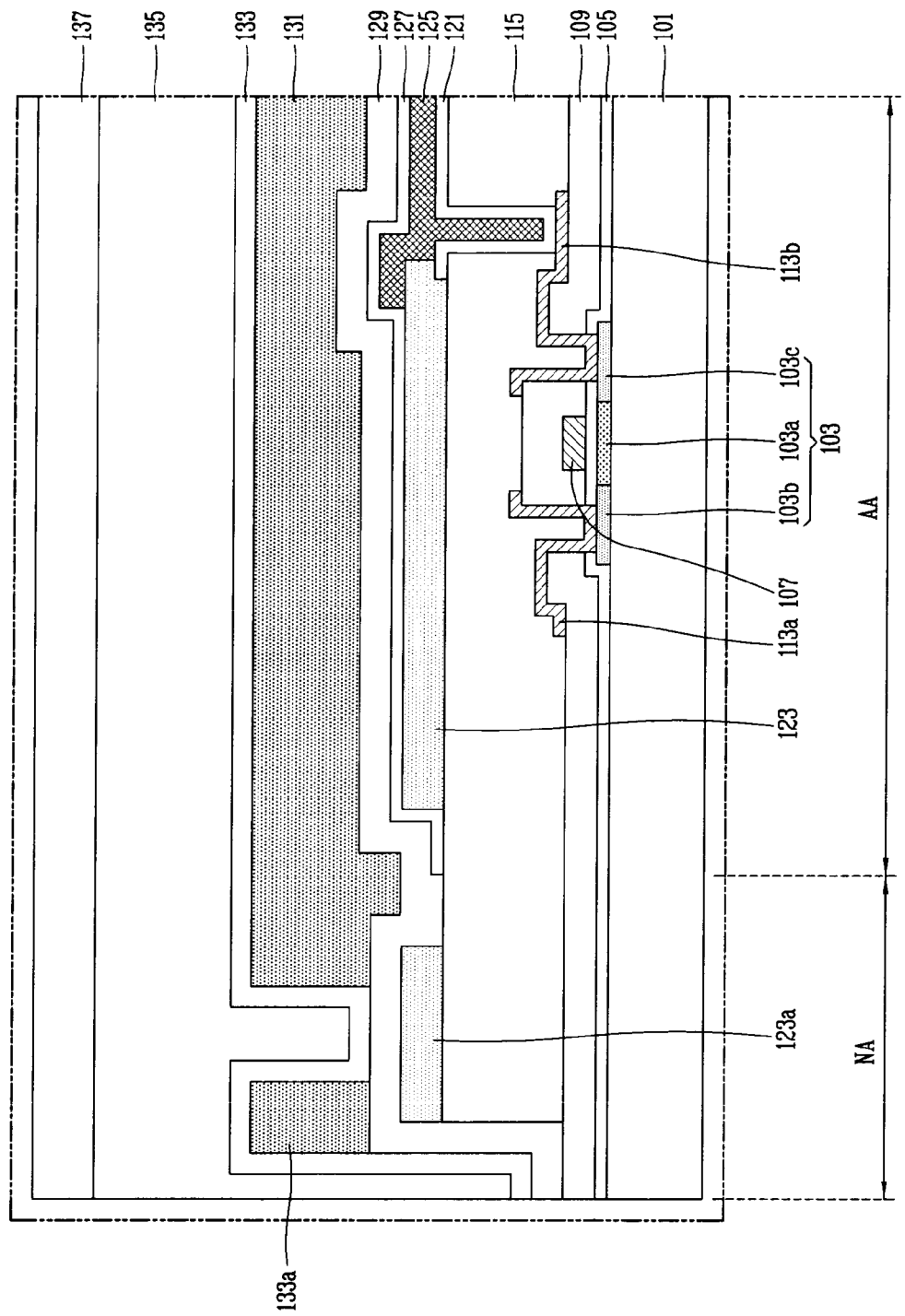
FIG. 7 is an enlarged sectional view of part 'B' in FIG. 6, which schematically illustrates a flexible OLED device where a partition wall pattern is formed in a non-active area so as to enclose an active area.

FIG. 7 is an enlarged sectional view of part 'B' in FIG. 6, which schematically illustrates a flexible OLED device where a partition wall pattern is formed in a non-active area so as to enclose an active area.

The flexible organic electroluminescent (OLED) device according to the present invention is divided into a top emission type and a bottom emission type according to a transmission direction of emitted light. Hereinafter, the top emission type will be explained.

Referring to FIGS. 5, 6 and 7, in the flexible OLED device according to the present invention, a substrate 101 where a driving thin film transistor (DTr) and a light emitting diode (E) have been formed is encapsulated by a protection film 137.

The flexible OLED device according to the present invention will be explained in more detail.

As shown in FIG. 5, the substrate 101 having a flexible characteristic has an active area (AA) and a non-active area (NA) outside the active area (AA). A plurality of pixel regions (P) defined by gate lines (not shown) and data lines (not shown) are provided on the active area (AA). A power line (not shown) is provided in parallel to the data lines (not shown).

The substrate 101 is formed of glass or plastic having a flexible characteristic so that the flexible OLED device can maintain a display performance even when folded or rolled-up like paper.

A buffer layer (not shown), formed of an insulating material, e.g., an inorganic insulating material such as silicon dioxide ($SiO_2$) or silicon nitride (SiNx), is formed on the substrate 101. The reason why the buffer layer (not shown) is formed below a semiconductor layer 103 to be formed during a subsequent process, is in order to prevent degradation of characteristics of the semiconductor layer 103 due to emission of alkali ions from inside of the substrate 101 when the semiconductor layer 103 is crystallized.

The semiconductor layer 103 is formed at each pixel region (P) in the active area (AA) above the buffer layer (not shown). The semiconductor layer 103 is formed in correspondence to a driving region (not shown) and a switching region (not shown). And the semiconductor layer 103 is composed of a first region 103a formed of pure poly silicone and forming a channel; and second regions 103b and 103c formed of pure poly silicone, disposed at two sides of the first region 103a, and to which impurities of high concentration are doped.

A gate insulating layer 105 is formed on the buffer layer including the semiconductor layer 103. A gate electrode 107 is formed on the gate insulating layer 105 in correspondence to the first region 103a of the semiconductor layer 103 in the driving region (not shown) and the switching region (not shown).

The gate line (not shown), connected to the gate electrode 107 formed at the switching region (not shown) and extending to one direction, is formed on the gate insulating layer 105. The gate electrode 107 and the gate line (not shown) may have a single layer structure, by being formed of a first metallic material having a low resistance characteristic, e.g., aluminum (Al), aluminum alloy (AlNd), copper (Cu), copper alloy, molybdenum (Mo), and molybdenum titanium (MoTi). Alternatively, the gate electrode 107 and the gate line (not shown) may have a double-layered or three-layered structure by being formed of more than two of the first metallic materials. In drawings, the gate electrode 107 and the gate line (not shown) have a single-layered structure.

An interlayer insulating layer 109, formed of an insulating material, e.g., an inorganic insulating material such as silicon dioxide ($SiO_2$) or silicon nitride (SiNx), is formed on an entire surface of the substrate including the gate electrode 107 and the gate line (not shown), in the active area. Semiconductor layer contact holes (not shown), through which the second regions 103b and 103c disposed at two sides of the first region 103a of the semiconductor layer 103 are exposed to outside, are provided at the interlayer insulating layer 109 and the gate insulating layer 105 formed therebelow.

Data lines (not shown), which define the pixel regions (P) by crossing the gate lines (not shown) and formed of a second metallic material layer, are formed on the interlayer insulting layer 109 including the semiconductor layer contact holes (not shown). The second metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them. A power line (not shown) is formed in a spaced manner from the data lines. The power line (not shown) may be formed on the gate insulating layer 105 where the gate lines (not shown) have been formed, in a spaced manner from the gate lines (not shown), in parallel thereto.

A source electrode 113a and a drain electrode 113b, made of the same second metallic material as the data lines (not shown), are formed at a driving region (not shown) and a switching region (not shown) on the interlayer insulating layer 109. The source electrode 113a and the drain electrode 113b are spaced from each other, and contact the second regions 103b and 103c exposed to outside through the semiconductor layer contact holes (not shown). Under such configuration, the semiconductor layer 103, the gate insulating layer 105, the gate electrode 107 and the interlayer insulating layer 109 sequentially deposited on the driving region (not shown), form a driving thin film transistor (DTr), together with the source electrode 113a and the drain electrode 113b which are spaced from each other.

In the drawings, all of the data lines (not shown), the source electrode 113a and the drain electrode 113b have a single-layered structure. However, the data lines (not shown), the source electrode 113a and the drain electrode 113b may have a double-layered structure or a three-layered structure.

Although not shown, a switching thin film transistor (not shown), which has the same lamination structure as the driving thin film transistor (DTr), is also formed at the switching region (not shown). The switching thin film transistor (not shown) is electrically connected to the driving thin film transistor (DTr), the gate line (not shown) and the data line (not shown). That is, the gate line (not shown) and the data line (not shown) are connected to a gate electrode (not shown) and a source electrode (not shown) of the switching thin film transistor, respectively. And a drain electrode (not shown) of the switching thin film transistor (not shown) is electrically connected to the gate electrode 107 of the driving thin film transistor (DTr).

The driving thin film transistor (DTr) and the switching thin film transistor (not shown) have the semiconductor layer 103 formed of poly silicon, and are configured as a top gate type. However, the driving thin film transistor (DTr) and the switching thin film transistor (not shown) may be configured as a bottom gate type which has a semiconductor layer formed of amorphous silicon.

In a case where the driving thin film transistor (DTr) and the switching thin film transistor (not shown) are configured as a bottom gate type, they may have a lamination structure of a gate electrode/a gate insulating layer/a semiconductor layer composed of one active layer formed of pure amorphous silicon, and two ohmic layers formed of impurity amorphous silicon and disposed at two sides of the active layer/and a source electrode and a drain electrode spaced from each other. The gate line is formed so as to be connected to the gate electrode of the switching thin film transistor. And the date line is formed so as to be connected to the source electrode of the switching thin film transistor.

A planarization layer 115, having a drain contact hole (not shown) through which the drain electrode 113b of the driving thin film transistor (DTr) is exposed to outside, is formed on the driving thin film transistor (DTr) and the switching thin film transistor (not shown). The planarization layer 115 may be formed of an insulating material. For instance, the planarization layer 115 may be formed of an inorganic insulating material such as silicon dioxide ($SiO_2$) or silicon nitride (SiNx).

A first electrode 121, which contacts the drain electrode 113c of the driving thin film transistor (DTr) through the drain contact hole (not shown), is formed on the planarization layer 115 in a separated manner for each pixel region (P).

Banks 123 and 123a, made of an insulating material, such as benzocyclobutene (BCB), polyimide or photo acryl, are formed on the first electrode 121, in the non-active area (NA) outside each pixel region (P). The bank 123 is formed to overlap the edge of the first electrode 121 with enclosing each pixel (P), and has a lattice shape having a plurality of openings in the entire active area (AA). The bank 123a is also formed in the non-active area (NA), i.e., at an outer portion of a panel.

An organic light-emitting layer 125, composed of organic light-emitting patterns (not shown) which emit red, green and blue light, is formed on the first electrode 121 in each pixel (P) enclosed by the banks 123 and 123a. The organic light-emitting layer 125 may be configured as a single layer formed of an organic light-emitting material. Although not shown, for enhanced light-emitting efficiency, the organic light-emitting layer 125 may be configured as a multi-layer formed of a hole injection layer, a hole transporting layer, an emitting material layer, an electron transporting layer and an electron injection layer.

A second electrode 127 is formed on the active area (AA) of the substrate including the organic light-emitting layer 125 and the banks 123 and 123a. The first electrode 121, the second electrode 127, and the organic light-emitting layer 125 interposed between the two electrodes 121 and 127 form a light-emitting diode (E).

In the light-emitting diode (E), once a prescribed voltage is applied to the first electrode 121 and the second electrode 127 according to a selected color signal, a hole injected from the first electrode 121 and an electron provided from the second electrode 127 are transferred to the organic light-emitting layer 125 to thus form exciton. When the exciton is transited from an excited state to a ground state, light is generated to be emitted in the form of visible rays. As the generated light is emitted to outside through the transparent second electrode 127, the flexible OLED device implements desired images.

A first passivation layer 129, made of an insulating material, especially, an inorganic insulating material such as silicon dioxide ($SiO_2$) or silicon nitride (SiNx), is formed on the entire surface of the substrate including the second electrode 127. The second electrode 127 alone cannot prevent introduction of water into the organic light-emitting layer 125. Accordingly, the first passivation layer 129 is formed on the second electrode 127 to completely prevent introduction of water into the organic light-emitting layer 125.

An organic layer 131, made of an organic material such as polymer, is formed on the first passivation layer 129 in the active area (AA). As the polymer of the organic layer 131, may be used olefine-based polymer (polyethylene, polypropylene), polyethylene terephthalate (PET), epoxy resin, fluoro resin, polysiloxane, etc.

A partition wall pattern 131a is formed on the first passivation layer 129 in the non-active area (NA), so as to enclose the active area (AA). The partition wall pattern 131a is formed of the same material as the organic layer 131, and is separated from the organic layer 131. The thickness (i.e., the height) of the organic layer 131 may be configured in various manners, and the size of the partition wall pattern 131a may be configured in various manners.

For prevention of introduction of water into the flexible OLED device through the organic layer 131, a second passivation layer 133, made of an insulating material, e.g., an inorganic insulating material such as silicon dioxide ($SiO_2$) or silicon nitride (SiNx), is further formed on the entire surface of the substrate including the organic layer 131 and the partition wall pattern 131a.

A barrier film 137 is positioned on the entire surface of the substrate 101 including the second passivation layer 133, so as to face the substrate 101, for encapsulation of the light-emitting diode (E). An adhesive 135 is interposed between the substrate 101 and the barrier film 137, so that the substrate 101 and the barrier film 137 can be completely attached to each other without an air layer therebetween. The adhesive 135 is formed of one of transparent frit having an adhesion property, an organic insulating material and a polymer material. In the present invention, the adhesive 135 is configured as a press sensitive adhesive (PSA).

As the substrate 101 and the barrier film 137 are attached to each other by the adhesive 135 to thus form a panel, the flexible OLED device according to the present invention is fabricated.

The flexible OLED device according to the present invention can have the following advantages.

Firstly, the partition wall pattern is formed in a separate manner from the organic layer formed in the active area. The partition wall pattern, formed to enclose the panel outside the panel, prevents water from being introduced into the OLED device. This can allow the OLED device to have enhanced reliability. Especially, the partition wall pattern is formed on the interlayer insulating layer or the bank in the non-active area. Under such configuration, introduction of water into the OLED device due to foreign materials can be prevented.

Further, even if water is introduced to the second passivation layer from a region outside the barrier film, the water is prevented from spreading into the panel, because the partition wall pattern is separated from the organic layer formed in the active area.

Further, water is prevented from spreading into the panel owing to the partition wall pattern formed in the non-active area so as to enclose the active area. Accordingly, introduction of water into the OLED device in high temperature and high humidity can be prevented.

Hereinafter, a method for fabricating a flexible OLED device according to the present invention will be explained in more detail with reference to FIGS. 8A to 8G.

FIGS. 8A to 8G are sectional views schematically illustrating a method for fabricating a flexible OLED device according to the present invention.

Figure 8A:
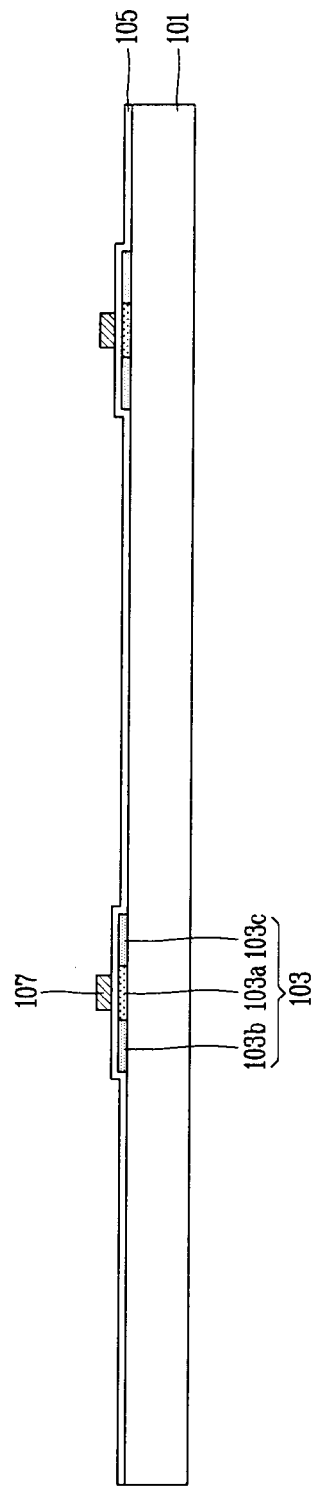

As shown in FIG. 8A, a substrate 101, having a flexible characteristic and on which an active region (AA) and a non-active area (NA) outside the active area (AA) are defined, is prepared. The substrate 101 is formed of glass or plastic having a flexible characteristic so that the flexible OLED device can maintain a display performance even when folded or rolled-up like paper.

Then, a buffer layer (not shown), formed of an insulating material, e.g., an inorganic insulating material such as silicon dioxide ($SiO_2$) or silicon nitride (SiNx), is formed on the substrate 101. The reason why the buffer layer (not shown) is formed below a semiconductor layer 103 to be formed during a subsequent process, is in order to prevent degradation of characteristics of the semiconductor layer 103 due to emission of alkali ions from inside of the substrate 101 when the semiconductor layer 103 is crystallized. Then, the semiconductor layer 103 is formed at each pixel region (P) in the active area (AA) above the buffer layer (not shown). The semiconductor layer 103 is formed in correspondence to a driving region (not shown) and a switching region (not shown). And the semiconductor layer 103 is composed of a first region 103a formed of pure poly silicone and forming a channel; and second regions 103b and 103c formed of pure poly silicone, disposed at two sides of the first region 103a, and to which impurities of high concentration are doped.

Then, a gate insulating layer 105 is formed on the buffer layer including the semiconductor layer 103. A gate electrode 107 is formed on the gate insulating layer 105 in correspondence to the first region 103a of the semiconductor layer 103 in the driving region (not shown) and the switching region (not shown).

A gate line (not shown), connected to the gate electrode 107 formed at the switching region (not shown) and extending to one direction, is formed on the gate insulating layer 105. The gate electrode 107 and the gate line (not shown) may have a single layer structure, by being formed of a first metallic material having a low resistance characteristic, e.g., aluminum (Al), aluminum alloy (AlNd), copper (Cu), copper alloy, molybdenum (Mo), and molybdenum titanium (MoTi). Alternatively, the gate electrode 107 and the gate line (not shown) may have a double-layered or three-layered structure by being formed of more than two of the first metallic materials. In drawings, the gate electrode 107 and the gate line (not shown) have a single-layered structure.

Figure 8B:
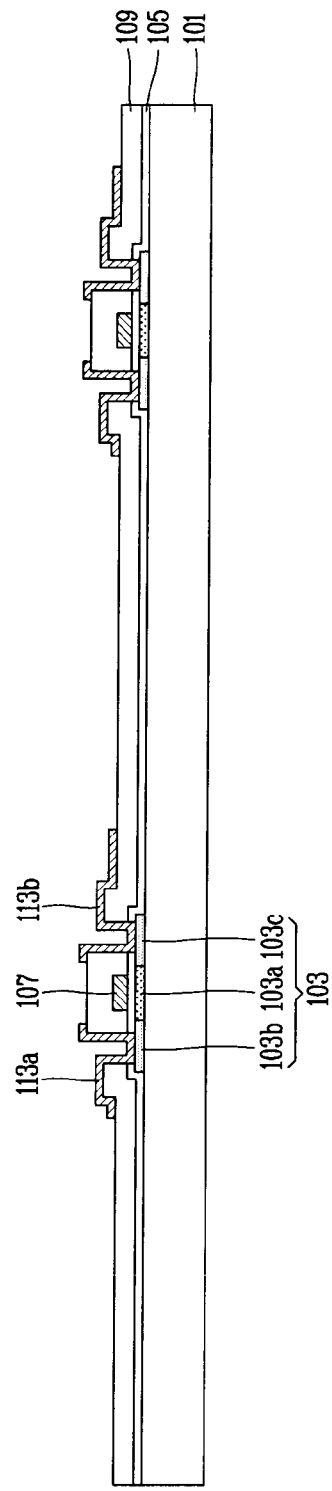

As shown in FIG. 8B, an interlayer insulating layer 109, formed of an insulating material, e.g., an inorganic insulating material such as silicon dioxide ($SiO_2$) or silicon nitride (SiNx), is formed on an entire surface of the substrate including the gate electrode 107 and the gate line (not shown), in the active area.

Then, the interlayer insulating layer 109 and the gate insulating layer 105 formed therebelow are selectively patterned, thereby forming semiconductor layer contact holes (not shown) through which the second regions 103b and 103c disposed at two sides of the first region 103a of the semiconductor layer 103 are exposed to outside.

As shown in FIG. 8C, a second metallic material layer (not shown) is formed on the interlayer insulting layer 109 including the semiconductor layer contact holes (not shown). The second metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them.

Then, the second metallic material layer (not shown) is selectively patterned, thereby forming data lines (not shown) which define the pixel regions (P) by crossing the gate lines (not shown), and forming a power line (not shown) spaced from the data lines. The power line (not shown) may be formed on the gate insulating layer 105 where the gate lines (not shown) have been formed, in a spaced manner from the gate lines (not shown), in parallel thereto.

When the data lines (not shown) are formed, a source electrode 113a and a drain electrode 113b are simultaneously formed. The source electrode 113a and the drain electrode 113b, made of the same metallic material as the data lines (not shown), are formed at a driving region (not shown) and a switching region (not shown) on the interlayer insulating layer 109. The source electrode 113a and the drain electrode 113b are spaced from each other, and contact the second regions 103b and 103c exposed to outside through the semiconductor layer contact holes (not shown). Under such configuration, the semiconductor layer 103, the gate insulating layer 105, the gate electrode 107 and the interlayer insulating layer 109 sequentially deposited on the driving region (not shown), form a driving thin film transistor (DTr), together with the source electrode 113a and the drain electrode 113b which are spaced from each other.

In drawings, all of the data lines (not shown), the source electrode 113a and the drain electrode 113b have a single-layered structure. However, the data lines (not shown), the source electrode 113a and the drain electrode 113b may have a double-layered structure or a three-layered structure.

Although not shown, a switching thin film transistor (not shown), which has the same lamination structure as the driving thin film transistor (DTr), is also formed at the switching region (not shown). The switching thin film transistor (not shown) is electrically connected to the driving thin film transistor (DTr), the gate line (not shown) and the data line (not shown). That is, the gate line (not shown) and the data line (not shown) are connected to a gate electrode (not shown) and a source electrode (not shown) of the switching thin film transistor, respectively. And a drain electrode (not shown) of the switching thin film transistor (not shown) is electrically connected to the gate electrode 107 of the driving thin film transistor (DTr).

The driving thin film transistor (DTr) and the switching thin film transistor (not shown) have the semiconductor layer 103 formed of poly silicon, and are configured as a top gate type. However, the driving thin film transistor (DTr) and the switching thin film transistor (not shown) may be configured as a bottom gate type which has a semiconductor layer formed of amorphous silicon.

In a case where the driving thin film transistor (DTr) and the switching thin film transistor (not shown) are configured as a bottom gate type, they may have a lamination structure of a gate electrode/a gate insulating layer/a semiconductor layer composed of one active layer formed of pure amorphous silicon, and two ohmic layers formed of impurity amorphous silicon and disposed at two sides of the active layer/and a source electrode and a drain electrode spaced from each other. The gate line is formed so as to be connected to the gate electrode of the switching thin film transistor. And the date line is formed so as to be connected to the source electrode of the switching thin film transistor.

As shown in FIG. 8C, a planarization layer 115 is formed on the driving thin film transistor (DTr) and the switching thin film transistor (not shown). The planarization layer 115 is formed of an insulating material, e.g., an inorganic insulating material such as silicon dioxide ($SiO_2$) or silicon nitride (SiNx).

Then, the planarization layer 115 is selectively patterned, thereby forming a drain contact hole (not shown) through which a drain electrode 113c of the driving thin film transistor (DTr) is exposed to outside.

Although not shown, a third metallic material layer (not shown) is deposited on the planarization layer 115, and then is selectively patterned, thereby forming a first electrode 121. The first electrode contacts the drain electrode 113c of the driving thin film transistor (DTr) through the drain contact hole (not shown), and is formed in a separated manner for each pixel region (P). The third metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them.

Then, an insulating material layer (not shown), formed of benzocyclobutene (BCB), polyimide or photo acryl, is formed on the first electrode 121, in the non-active area (NA) outside each pixel region (P).

Then, as shown in FIG. 8D, the insulating material layer (not shown) is selectively patterned, thereby forming banks 123 and 123a. The bank 123 is formed to overlap the edge of the first electrode 121 with enclosing each pixel (P), and has a lattice shape having a plurality of openings in the entire active area (AA). The bank 123a is also formed in the non-active area (NA), i.e., at an outer portion of a panel.

Figure 8E:
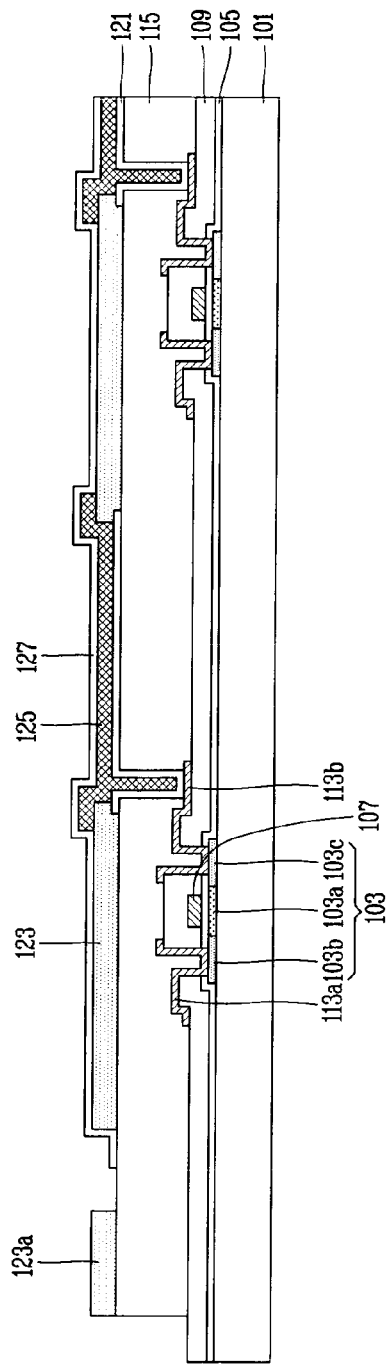

Then, as shown in FIG. 8E, an organic light-emitting layer 125, composed of organic light-emitting patterns (not shown) which emit red, green and blue light, is formed on the first electrode 121 in each pixel (P) enclosed by the banks 123 and 123a. The organic light-emitting layer 125 may be configured as a single layer formed of an organic light-emitting material. Although not shown, for enhanced light-emitting efficiency, the organic light-emitting layer 125 may be configured as a multi-layer formed of a hole injection layer, a hole transporting layer, an emitting material layer, an electron transporting layer and an electron injection layer.

Then, a second electrode 127 is formed on the active area (AA) of the substrate including the organic light-emitting layer 125 and the banks 123 and 123a. As the second electrode 127, at least one of a transparent conductive material including ITO and a transparent conductive material including IZO may be selected. The first electrode 121, the second electrode 127, and the organic light-emitting layer 125 interposed between the two electrodes 121 and 127 form a light-emitting diode (E).

In the light-emitting diode (E), once a prescribed voltage is applied to the first electrode 121 and the second electrode 127 according to a selected color signal, a hole injected from the first electrode 121 and an electron provided from the second electrode 127 are transferred to the organic light-emitting layer 125 to thus form exciton. When the exciton is transited from an excited state to a ground state, light is generated to be emitted in the form of visible rays. As the generated light is emitted to outside through the transparent second electrode 127, the flexible OLED device implements desired images.

Figure 8F:
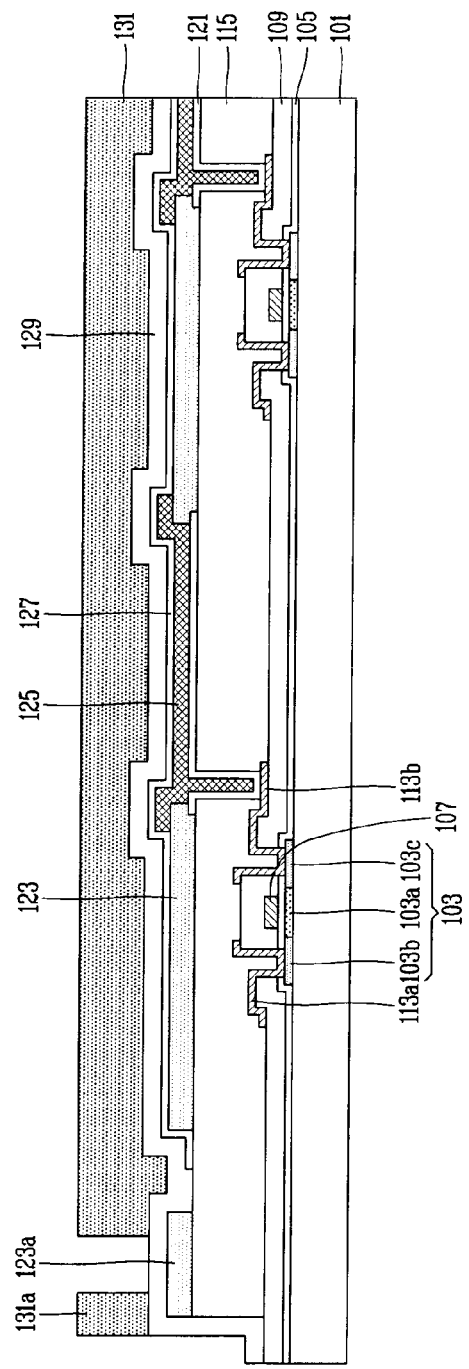

As shown in FIG. 8F, a first passivation layer 129, made of an insulating material, especially, an inorganic insulating material such as silicon dioxide ($SiO_2$) or silicon nitride (SiNx), is formed on the entire surface of the substrate including the second electrode 127. The second electrode 127 alone cannot prevent introduction of water into the organic light-emitting layer 125. Accordingly, the first passivation layer 129 is formed on the second electrode 127 to completely prevent introduction of water into the organic light-emitting layer 125.

Then, an organic layer 131 and a partition wall pattern 131a, made of an organic material such as polymer, are simultaneously formed on the first passivation layer 129 in the active area (AA) and the non-active area (NA), by a deposition method such as screen printing. As the polymer of the organic layer 131 and the partition wall pattern 131a, may be used olefine-based polymer (polyethylene, polypropylene), polyethylene terephthalate (PET), epoxy resin, fluoro resin, polysiloxane, etc. The organic layer 131 is formed in the active area (AA). As shown in FIG. 5, the partition wall pattern 131a is formed in the non-active area (NA) so as to enclose the active area (AA). The partition wall pattern 131a is formed of the same material as the organic layer 131, and is separated from the organic layer 131. The thickness (i.e., the height) of the organic layer 131 may be configured in various manners, and the size of the partition wall pattern 131a may be configured in various manners.

Figure 8G:
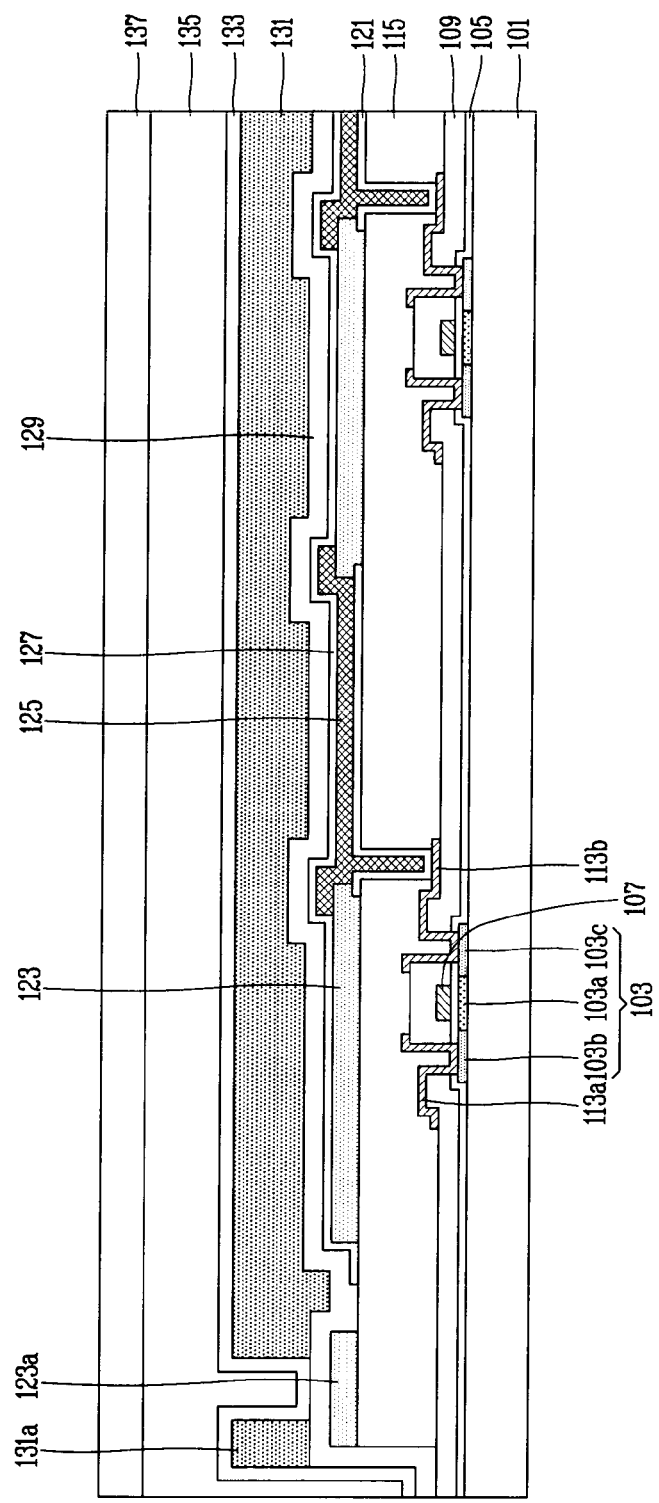

As shown in FIG. 8G, a second passivation layer 133, configured to prevent introduction of water into the flexible OLED device through the organic layer 131, is further formed on the entire surface of the substrate including the organic layer 131 and the partition wall pattern 131a. The second passivation layer 133 is formed of an insulating material, e.g., an inorganic insulating material such as silicon dioxide ($SiO_2$) or silicon nitride (SiNx).

Then, a barrier film 137 is positioned on the entire surface of the substrate 101 including the second passivation layer 133, so as to face the substrate 101, for encapsulation of the light-emitting diode (E). An adhesive 135 is interposed between the substrate 101 and the barrier film 137, so that the substrate 101 and the barrier film 137 can be completely attached to each other without an air layer therebetween. The adhesive 135 is formed of one of transparent frit having an adhesion property, an organic insulating material and a polymer material. In the present invention, the adhesive 135 is configured as a press sensitive adhesive (PSA).

As the substrate 101 and the barrier film 137 are attached to each other by the adhesive 135 to thus form a panel, the flexible OLED device according to the present invention is fabricated.

The method for fabricating a flexible OLED device according to the present invention can have the following advantages.

Firstly, the partition wall pattern is formed in a separate manner from the organic layer formed in the active area. The partition wall pattern, formed to enclose the panel outside the panel, prevents water from being introduced into the OLED device. This can allow the OLED device to have enhanced reliability. Especially, the partition wall pattern is formed on the interlayer insulating layer or the bank in the non-active area. Under such configuration, introduction of water into the OLED device due to foreign materials can be prevented. Further, even if water is introduced to the second passivation layer from a region outside the barrier film, the water is prevented from spreading into the panel, because the partition wall pattern is separated from the organic layer formed in the active area.

Secondly, water is prevented from spreading into the panel owing to the partition wall pattern formed in the non-active area so as to enclose the active area. Accordingly, introduction of water into the OLED device in high temperature and high humidity can be prevented.

Thirdly, as step coverage occurring from a lower part of the thin film transistor is reduced, an auto clave process can be omitted. This can simplify the entire processes.

Fourthly, as the auto clave process omitted, other problems such as occurrence of spots and introduction of water can be prevented. This can allow the OLED device to have an enhanced yield.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A flexible organic electroluminescent device, comprising:
    a substrate divided into an active area including a plurality of pixel regions, and a non-active area formed outside the active area;
    a switching thin film transistor and a driving thin film transistor at each of the pixel regions on the substrate;
    an interlayer insulating layer on the substrate including the switching thin film transistor and the driving thin film transistor, and configured to expose a drain electrode of the driving thin film transistor therethrough;
    a first electrode at each pixel region on the interlayer insulating layer, and connected to the drain electrode of the driving thin film transistor;
    a bank in the non-active area of the substrate;
    an organic light-emitting layer on the first electrode, and separated from each other at each pixel region;
    a second electrode on the organic light-emitting layer, in the active area;
    a first passivation layer on an entire surface of the substrate including the second electrode;
    an organic layer on the first passivation layer, in the active area;
    a partition wall pattern on the first passivation layer in the non-active area so as to enclose the active area, wherein the partition wall pattern is formed in a separated manner from the organic layer;
    a second passivation layer on the first passivation layer including the organic layer and the partition wall pattern;
    a barrier film disposed to face the substrate; and
    an adhesive interposed between the substrate and the barrier film, and configured to adhere the substrate and the barrier film to each other to form a panel.

2. The flexible organic electroluminescent device of claim 1, wherein the partition wall pattern and the organic layer are formed of the same layer.

3. The flexible organic electroluminescent device of claim 1, wherein the partition wall pattern and the organic layer are formed of an organic insulating materials including a polymer.

4. The flexible organic electroluminescent device of claim 1, wherein the substrate is formed of a flexible glass substrate or a plastic material.

* * * * *